(12) United States Patent
Garrett, Jr. et al.

(10) Patent No.: US 6,870,419 B1
(45) Date of Patent: Mar. 22, 2005

(54) MEMORY SYSTEM INCLUDING A MEMORY DEVICE HAVING A CONTROLLED OUTPUT DRIVER CHARACTERISTIC

(75) Inventors: Billy Wayne Garrett, Jr., Mountain View, CA (US); John B. Dillon, deceased, late of Palo Alto, CA (US); by Nancy David Dillon, legal representative, Marshall, VA (US); Michael Tak-Kei Ching, Sunnyvale, CA (US); William F. Stonecypher, San Jose, CA (US); Andy Peng-Pui Chan, San Jose, CA (US); Matthew M. Griffin, Mountain View, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 10/625,264

(22) Filed: Jul. 23, 2003

Related U.S. Application Data

(63) Continuation of application No. 10/230,931, filed on Aug. 29, 2002, now Pat. No. 6,608,507, which is a continuation of application No. 09/954,561, filed on Sep. 12, 2001, now Pat. No. 6,556,052, which is a continuation of application No. 09/882,420, filed on Jun. 14, 2001, now Pat. No. 6,462,591, which is a continuation of application No. 09/559,115, filed on Apr. 26, 2000, now Pat. No. 6,294,934, which is a continuation of application No. 09/141,675, filed on Aug. 27, 1998, now Pat. No. 6,094,075.
(60) Provisional application No. 60/073,353, filed on Feb. 2, 1998, and provisional application No. 60/057,400, filed on Aug. 29, 1997.

(51) Int. Cl.[7] .............................................. G05F 1/10
(52) U.S. Cl. ...................................................... 327/535
(58) Field of Search .............................. 326/30, 31, 33, 326/34; 327/77, 88, 89, 108, 109, 112, 530, 534, 538, 543

(56) References Cited

U.S. PATENT DOCUMENTS

| 3,646,329 A | 2/1972 | Yoshino et al. |
| 4,192,005 A | 3/1980 | Kurtz |

(List continued on next page.)

FOREIGN PATENT DOCUMENTS

| EP | 0482392 | 2/1991 |
| JP | 63-276935 | 11/1988 |
| JP | 03-087907 | 4/1991 |
| JP | 04-117709 | 4/1992 |

OTHER PUBLICATIONS

Reynolds, C.B., "Analysis and Guidelines for High–Speed VLSI System Interconnections," IEEE 1988 Custom Integrated Circuits Conference, pp. 23.5.1–23.5.4.

Leung, Kam, "Controlled Slew Rate Output Buffer," IEEE 1988 Custom Integrated Circuits Conference, pp. 5.5.1–5.5.4.

Knight, Thomas F. Jr., and Krymm, Alexander, "A Self–Terminating Low–Voltage Swing CMOS Output Driver," Journal of Solid State Circuits, vol. 23, No. 2, Apr. 1998, pp. 457–464.

(List continued on next page.)

Primary Examiner—Jeffrey Zweizig
(74) Attorney, Agent, or Firm—Vierra Magen Marcus Harmon & DeNiro LLP

(57) ABSTRACT

An output driver circuit and current control technique to facilitate high-speed buses with low noise is used to interface with high-speed dynamic RAMs (DRAMs). The architecture includes the following components: an input isolation block (120), an analog voltage divider (104), an input comparator (125), a sampling latch (130), a current control counter (115), and a bitwise output driver (output driver A 107 and output driver B 111).

42 Claims, 12 Drawing Sheets

Current Control Logic Diagram

U.S. PATENT DOCUMENTS

| | | |
|---|---|---|
| 4,315,210 A | 2/1982 | Michel et al. |
| 4,329,600 A | 5/1982 | Stewart |
| 4,414,480 A | 11/1983 | Zasio |
| 4,481,625 A | 11/1984 | Roberts et al. |
| 4,549,124 A | 10/1985 | Beier |
| 4,680,487 A | 7/1987 | Kobayashi |
| 4,691,127 A | 9/1987 | Huizer |
| 4,707,620 A | 11/1987 | Sullivan et al. |
| 4,715,003 A | 12/1987 | Keller et al. |
| 4,719,369 A | 1/1988 | Asano et al. |
| 4,728,881 A | 3/1988 | Evans et al. |
| 4,765,188 A | 8/1988 | Krechmery et al. |
| 4,779,013 A | 10/1988 | Tanaka |
| 4,859,877 A | 8/1989 | Cooperman et al. |
| 4,860,198 A | 8/1989 | Takenaka |
| 4,894,562 A | 1/1990 | Cavaliere et al. |
| 4,939,389 A | 7/1990 | Cox et al. |
| 4,958,520 A | 9/1990 | Trommler et al. |
| 4,967,105 A | 10/1990 | Akamatsu et al. |
| 4,977,333 A | 12/1990 | Suzuki et al. |
| 4,992,724 A | 2/1991 | Hisanaga et al. |
| 5,023,488 A | 6/1991 | Gunning |
| 5,024,101 A | 6/1991 | Tanaka et al. |
| 5,045,730 A | 9/1991 | Cooperman et al. |
| 5,045,832 A | 9/1991 | Tam |
| 5,055,715 A | 10/1991 | Inaba |
| 5,075,569 A | 12/1991 | Branson |
| 5,081,379 A | 1/1992 | Korteling |
| 5,097,148 A | 3/1992 | Gabara |
| 5,107,230 A | 4/1992 | King |
| 5,117,130 A | 5/1992 | Shoji |
| 5,118,971 A | 6/1992 | Schenck |
| 5,121,064 A | 6/1992 | Eller |
| 5,134,311 A | 7/1992 | Biber et al. |
| 5,165,046 A | 11/1992 | Hesson |
| 5,185,538 A | 2/1993 | Kondoh et al. |
| 5,194,765 A | 3/1993 | Dunlop et al. |
| 5,206,546 A | 4/1993 | Usami |
| 5,237,214 A | 8/1993 | Usami |
| 5,254,883 A | 10/1993 | Horowitz et al. |
| 5,296,756 A | 3/1994 | Patel et al. |
| 5,387,824 A | 2/1995 | Michelsen |
| 5,457,407 A | 10/1995 | Shu et al. |
| 5,546,042 A | 8/1996 | Tedrow et al. |
| 5,568,068 A | 10/1996 | Ota et al. |
| 5,578,940 A | 11/1996 | Dillon et al. |
| 5,596,285 A | 1/1997 | Marbot et al. |
| 5,778,419 A | 7/1998 | Hansen et al. |
| 5,838,177 A | 11/1998 | Keeth |
| 5,977,797 A | 11/1999 | Gasparik |
| 6,009,487 A | 12/1999 | Davis et al. |
| 6,072,747 A | 6/2000 | Yoon |
| 6,442,644 B1 | 8/2002 | Gustavson et al. |

OTHER PUBLICATIONS

Cox, Dennis T., et al.,"VLSI Performance Compensation for Off–Chip Drivers and Clock Generation," IEEE 1989 Custom Integrated Circuits Conf., pp. 14.3.1–14.3.4.

Douseki, Takakuni and Ohmori, Yasuo, "BICMOS Circuit Technology for a High–Speed SRAM," IEEE Journal of Solid–State Circuits, vol. 23, No. 1, Feb. 1988, pp. 68–73.

"Driver with Noise–Dependent Switching Speed Control," IBM Technical Disclosure Bulletin, vol. 29, No. 3, Aug. 1986, IBM Corporation, pp. 1243–1244.

Biber, Alice I. "The Design of an Application Specific Interface Drive for a High Capacitive Load," Masters Thesis at the Massachusetts Inst. of Technology, Dec. 1989.

Raver, Norman, "Open–Loop Gain Limitations for Push– Pull Off–Chip Drivers," Journal of Solid–State Circuits, vol. SC–22, No. 2, Apr. 1987, pp. 145–150.

Senbon, T. and Hanabuchi, F., Instrumentation Systems: Fundamentals and Applications, Chapter 3: Detection and Conversion of Industrial Variables; 1991, 11 pages.

Johnson, C. and Richeh, H, "Highly Accurate Resistance Deviation to Frequency Converter with Programmable Sensitivity and Resolution," IEEE vol. IM–35, No. 2, Jun. 1986, 4 pages.

Sasaki, H., et al., "High Precision Automated Resistance Measurement Using a Modified Wheatstone Bridge," CPEM '88 Digest, Japan, 1988, 1 page.

Sasaki, H., et al.,"Measurement of the Pressure Dependence of Standard Resistors Using A Modified Wheatstone Bridge," Trans. IEE of Japan, vol. 109, No. 1/2,Jan./Feb. 1989, 6 pages.

Sasaki, H., et al., "Automated Measurement System for 1–.OMEGA.Standard Resistors Using A Modified Wheatstone Bridge," IEEE Trans. on Instr. and Mesurement, vol. 40, No. 2, Apr. '91, p. 274–277.

Sasaki, H., et al.,"A Modified Wheatstone Bridge for High– –Precision Automated Resistance Measurement," IEEE Trans. on Instr. and Measurement, vol. 26, No. 2, Dec. 1987, p. 947–949.

Armstrong, David H., "Pitfalls in Testing Digital ASIC Devices," IEEE 1987 Custom Integrated Circuits Conference, pp. 573–578.

Matthews, John W. and Erdelyi, Charles K. "Power Supply Votages for Future VLSI," IEEE 1986 Custom Integrated Circuits Conference, pp. 149–152.

Gillingham, Peter, MOSAID Technologies, Inc., "SLDRAM Architectural and Functional Overview", 1997 SLDRAM Consortium, Aug. 29, 1997, pp. 1–14.

Gillingham, Peter, and Vogley, Bill, "SLDRAM" High–Performance, Open–Standard Memory, 1997 IEEE, Nov./ Dec. 1997, pp. 29–39.

Draft 0.99 IEEE P1596.7–199X, "Draft Standard for A High–Speed Memory Interface (SyncLink)", Oct. 14, 1996 IEEE.

Gabara et al., "Digitally Adjustable Resistors in CMOS for High–Performance Applications", IEEE Journal of Solid– State Circuits, vol. 27, No. 8, Aug. 1992.

FIG. 2  Block Diagram of Current Control Circuitry.

Current Control Counter with TestModes

Current Control Logic Diagram

MEMORY SYSTEM INCLUDING A MEMORY DEVICE HAVING A CONTROLLED OUTPUT DRIVER CHARACTERISTIC

This is a continuation of application Ser. No. 10/230,931 filed on Aug. 29, 2002 now U.S. Pat. No. 6,608,507); which is a continuation of application Ser. No. 09/954,561 filed on Sep. 12, 2001 (now U.S. Pat. No. 6,556,052); which is a continuation of application Ser. No. 09/882,420, filed on Jun. 14, 2001 (now U.S. Pat. No. 6,462,591); which is a continuation of application Ser. No. 09/559,115, filed on Apr. 26, 2000 (now U.S. Pat. No. 6,294,934), which is a continuation of application Ser. No. 09/141,675, filed on Aug. 27, 1998 (now U.S. Pat. No. 6,094,075), which claims priority to Provisional Patent Application Ser. No. 60/073,353, filed on Feb. 2, 1998, and the Provisional Patent Application Ser. No. 60/057,400, filed on Aug. 29, 1997.

BACKGROUND OF THE INVENTION

1. Field of the Invention

The present invention relates to the field of integrated circuits and high-speed buses. More specifically, the present invention relates to a circuit for a high-speed driver and techniques for obtaining rapid switching speed with low power consumption and low noise on high-speed buses.

2. Description of the Related Art

To obtain rapid switching speed on a bus with low power consumption and low noise, it is desirable for a current mode driver to set and control the current at which the driver operates. U.S. Pat. No. 5,254,883, assigned to the assignee of die present invention, and incorporated herein by reference, discusses an apparatus and method for setting and maintaining the operating current of a current mode driver for a bus. Essentially, for a bus with a master-slave architecture, there arm two problems to be solved in setting the operating current on the bus. First, the operating current of the master's current mode drivers should be property set. Second, the operating current of the slave's current mode drivers should be properly set. Once these cults are set, they are maintained at those settings despite process, voltage and temperature variations by circuitry in the master and slave devices.

A master-slave bus architecture is discussed in the '883 patent in which a master may send data to and receive data from a slave. A slave may send data to and receive data from a master, but not another slave. The master sets its operating current for its drivers and each slave sets the operating current for its drivers.

The master employs an adjustable current sink as a driver for each bus line that it drives. The current sink turns on to drive the voltage on the bus line, $V_{out}$, to a voltage closer to ground and turns off to allow a termination resistor, $R_{term}$, on the bus line to pull the bus line closer to the terminator voltage, $V_{term}$. The current in the driver, $I_d$, is set by a digital counter whose count is determined from a feedback circuit having a comparator. If the count is all zeros then no current flows in the driver and the voltage on the bus line, $V_{out}$, is the termination voltage, $V_{term}$. If the count is all ones, then the maximum current flows in the driver and the voltage on the bus line, $V_{out}$, equals $V_{term} - I_d * R_{term}$.

The feedback circuit compares a voltage reference, $V_{ref}$, to a node voltage, $V_a$, derived from a scaled reference driver which receives the count from the counter. Feedback assures that the node voltage matches the reference voltage, $V_a = V_{ref}$. When the match occurs the reference driver has an output swing (i.e., change in voltage) of $(V_{term} - V_{ref})$ and the actual output driver has a swig of $2*(V_{term} - V_{ref})$ due to the scaling between the reference driver and the actual output driver. Therefore, $V_{out}$ equals $(V_{term} - 2)*(V_{term} - V_{ref})$. Thus, by selecting a value for $V_{term}$ and $V_{ref}$ any size symmetric voltage swing about $V_{ref}$ may be achieved.

The slave in the '883 patent also employs an adjustable current sink as a driver for each bus line that it drives. A counter similarly controls the value of the current in the driver such that the driver may swing between $V_{term}$ and $V_{term} - I_4 * R_{term}$, where $I_4$ is the current setting in the driver of the slave. However, the value in the counter is directly proportional to the value of an RC time constant whose capacitance C, is set by the master. The master also determines whether the value of $V_{out}$ from the driver matches $V_{ref}$ in the master. It adjusts the RC time constant so that the count in the counter will set a current in the driver and $V_{out}$ will match $V_{ref}$. Thus $V_{out}$ will equal $V_{term} - (V_{term} - V_{ref})$. In order to produce a symmetric swing about $V_{ref}$ another step is required. The master should double the value of the RC time constant which will double the count. This will produce a $V_{out}$ which is equal to $V_{term} - 2*(V_{term} - V_{ref})$.

Maintenance of the current setting of the driver in the slave may be performed in a manner different from that in the master. In the slave, the effective R in the RC time constant is derived from a reference voltage and reference cure. If due to variations in temperature or supply voltage, the reference current decreases then the effective R in the RC time constant increases. This increases the count and the operational current setting of the driver in the slave, thus compensating for the effect. If the reference current increases, the effective R and the count decrease, again compensating for the change.

While the above techniques of setting and maintaining operating current in the master and slave bus line drives have met with substantial success, the techniques are not without certain shortcomings. For example, the technique of setting the current in the master requires an extra pin dedicated to receive the external resistor. Another shortcoming is selecting the proper value of the external resistor to maintain the factor of two scaling between $(V_{term} - V_a)$ and $(V_{term} - V_{out})$. If the scaling is not precisely set, the output swing is not symmetric about $V_{ref}$. Further, as process, voltage, or temperature variations occur, the value selected for the resistor may not be ideal. A further shortcoming is that an electrostatic discharge structure (ESD) in series with the pin receiving the external resistor adds a variable amount of resistance in series with the external resistor. This make: the selection of the external resistance subject to variations in the ESD structure.

Further, a shortcoming in the technique of setting the current in the slave is that a relatively complex algorithm between the slave and the master is required to correctly set the current in the slave. The master sets the RC the constant which in turn determines the count and the output value. The master then tests the output value to determine whether it matches $V_{ref}$. If not, it increases the count and retests the output value. This cycle continue until a match occurs. However, a match of $V_{out}$ to $V_{ref}$ for one bus line, does not always insure that a match will occur on another bus line due to small differences in characteristics between output drivers, bus lines, and $V_{ref}$ comparison circuits.

As can be seen, an improved output driver circuit and techniques for obtaining rapid switching speed with low power consumption and low noise is needed.

SUMMARY OF THE INVENTION

The present invention includes a circuit and current control technique to enable high-speed buses with low noise.

This circuitry may be used in the interfacing of high-speed dynamic RAMs (DRAMs). The architecture of the present invention includes the following components: an input isolation block (Isolation), an analog voltage divider (AVD), an input comparator, a sampling latch, a current control counter, and a bitwise output driver (output driver A and output driver B).

A fundamental operation of the current control mechanism is to evaluate the voltage levels $V_{hi}$, $V_{low}$, and $V_{ref}$, and increment or decrement the current control counter accordingly to set an appropriate output level. When the current control circuitry is in an evaluation mode, output driver A is off (not sinking current), and node BDA is at the output high voltage level (typically $V_{term}$). Output driver B is active, and pulls node BDB to the low voltage output level. The voltage levels at nodes BDA and BDB are passed through the isolation block and fed into the analog voltage divider. The analog voltage divider outputs a voltage level which is a weighted average of it's input. $V_{out}=(A*V_{hi})+(B*V_{low})$ For example, in a specific case, $V_{out}=(0.5*V_{hi})+(0.5*V_{low})$.

The input comparator compares $V_{out}$ and $V_{ref}$ and generates an up sigpal. The up signal is sampled, and used to increment or decrement the current control value held in the current control counter. By repeating this process the current control value will settle to a value where $Vol=(V_{ref}-A*V_{term})/B$.

When the current control circuitry is not active, the input isolation block shields any interactions of the analog voltage divider circuitry and the output pad.

The output driver is composed of a series of individual output transistors an example of which is shown in FIG. 4. The number of active output transistor blocks are selected with control signal ictrl[n:O]. The width of the output devices may be scaled in a geometric fashion to allow encoding of the ictrl[n:O] signal.

The input isolation gates may be implemented as CMOS pass gates, NMOS passgates with boosted gate voltages, unity gain buffers, or operational amplifiers (op amps). The analog voltage divider may be implemented with a resistor divider, a digital-to-analog converter, or switched capacitor filter such as a sigma/delta modulator. The sampling latch may be implemented as a simple flip-flop or latch, or a series of sequential elements with logic to average the sampled value. The current control counter may be implemented as an up-down counter or a more sophisticated counter such as a saturating binary search counter.

Other objects, features, and advantages of the present invention will become apparent upon consideration of the following detailed description and the accompanying drawings, in which like reference designations represent like features throughout the figures.

DESCRIPTION OF THE PREFERRED EMBODIMENTS

Figure 1:
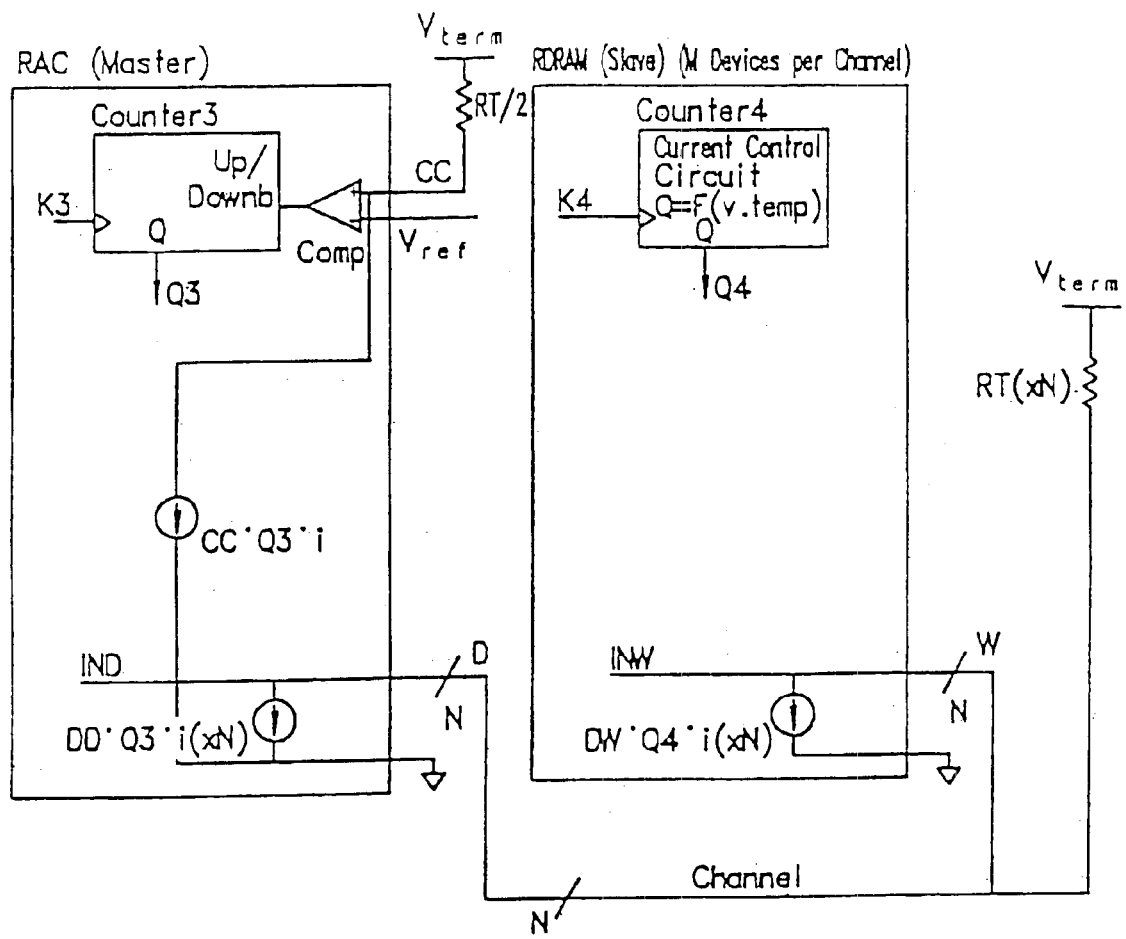
FIG. 1 illustrates a prior art implementation of a current control circuit having a master device and slave device.

The present invention provides an improved apparatus and method of setting the current in master and slave devices connected to a common bus. FIG. 1 is a block diagram of a current control implementation with a master device (RAC) and a slave device (RDRAM), in accordance with the prior art FIG. 1 is simplified to display only a single slave device RDRAM, however it should be appreciated that many slave devices may be used in connection with the master device RAC.

In accordance with the prior art, the master device RAC has a dedicated output pin CC. The output pin CC is connected to a termination voltage $V_{term}$ through a resistor $R_{term}/2$. If the output driver is an ideal current source, then the voltage output will be the middle of the swing. This value is compared to $V_{ref}$ and adjusted up or down accordingly.

For the slave device RDRAM, there is a circuit that indirectly infers the amount to adjust the output current depending on variations of voltage and temperature. The original proper value is established by running a current control initialization routine which requires reading data back through the master device and detecting the fist time valid ones are transmitted on the bus. This threshold is discovered and then doubled (approximately) before being sent to the slave device.

The technique shown in FIG. 1 requires N+1 pins on the master device, and N pins on the slave device. The additional pin on the master device is required for the CC connection shown in FIG. 1. The device of FIG. 1 also requires the resistor RT/2 on the printed circuit board upon which the master device is mounted. Unfortunately, the RT/2 resistor may not have the desired value. The current produced by the output transistor varies slightly as the voltage changes, which means there are non-ideal effects of the V-I characteristics of the output transistor, such as channel length modulation. So although it is desirable for the current control resistor to be $R_{term}/2$ its value is more likely about $R_{term}/2.2$. The value also varies somewhat due to differences in process, vendor, and temperature.

Internal to the master device RAC, there is an input comparator COMP. The comparator compares $V_{ref}$ to the voltage on the current control pin (CC). If the voltage comparison determines the output is too low, then a counter (Counter3) is incremented, thereby increasing the current of all the output drivers on the chip (during the next current control cycle). If the current is too high, then the counter (Counter3) is subsequently decreased. By selecting the proper resistor (which is difficult to do), the current control circuit adjusts the output drive at regular intervals to keep the full voltage swing of the remaining pins. This then tracks any drift of the transistors due to voltage or temperature effects, allows for different process variations chip to chip, and provides many similar benefits. However, selecting the proper resistor value to achieve this result is difficult.

A further technique involves using an expansion mechanism referred to as "y-channel." However, this technique requires that the resistor value be changed (essentially halved) when the module is inserted, compared to the case when it is not inserted. This may be achieved by adding a parallel current control resistor to the one on the motherboard which essentially changes the parallel resistance so that the output current is doubled. Unfortunately, the non-linear nature of the transistors again requires that a "special" resistor value be calculated in order to double the current. Once the proper resistor value is found, automatic tracking is still assured using the expansion mechanism.

A consideration that needs to be addressed for some integrated circuits is that an electrostatic discharge (ESP) structure may be placed in series with the current control pin. This adds a variable amount of resistance, significant enough to change the needed external resistor value substantially. The resistance of such an ESD structure needs to be accounted for.

As known in the art, current control calibrations are performed during "quiet" times on the bus. That is, the current control calibrations are "scheduled" between activities on the bus.

Figure 2:
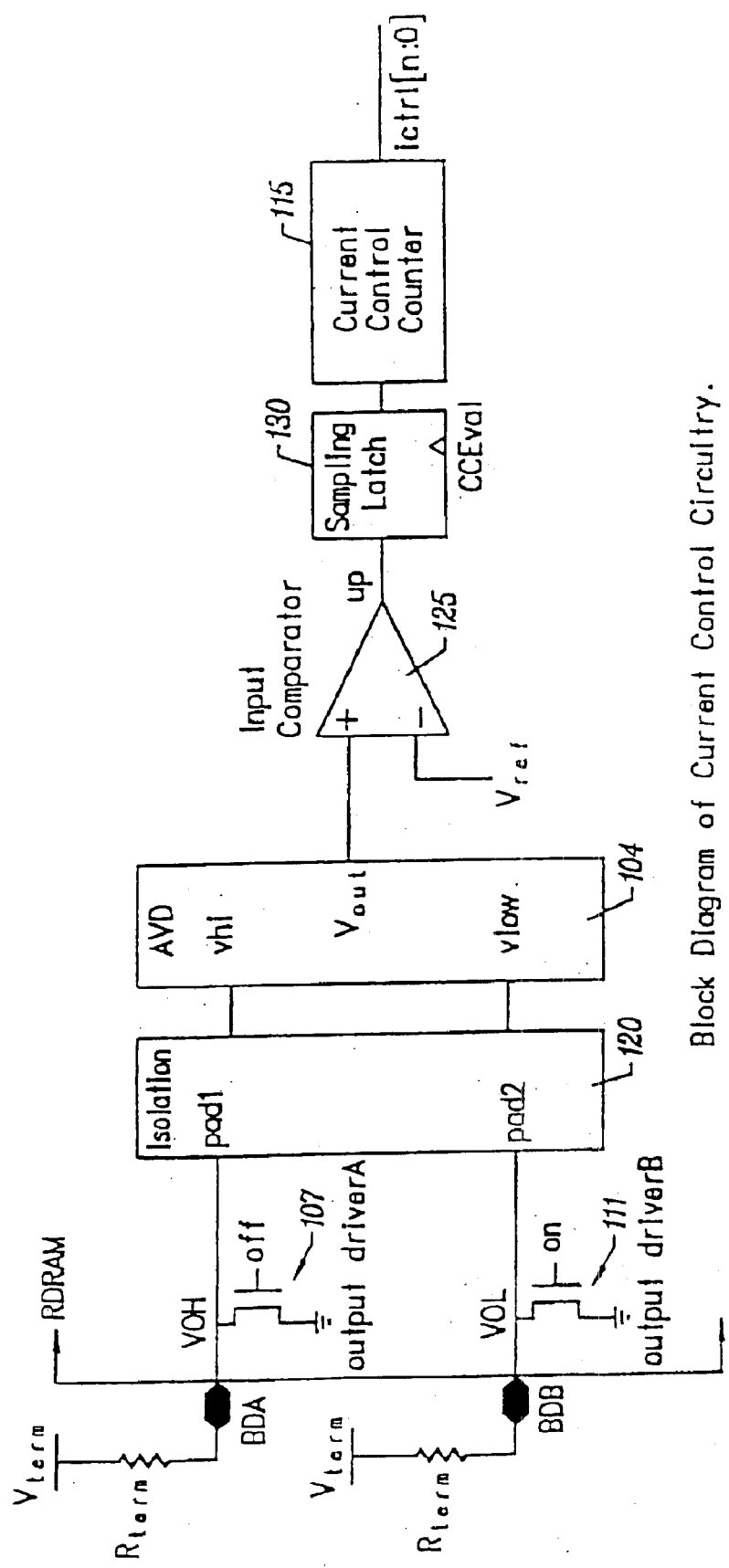
FIG. 2 shows a block diagram of current control circuitry in accordance with an embodiment of the present invention.
Figure 3:
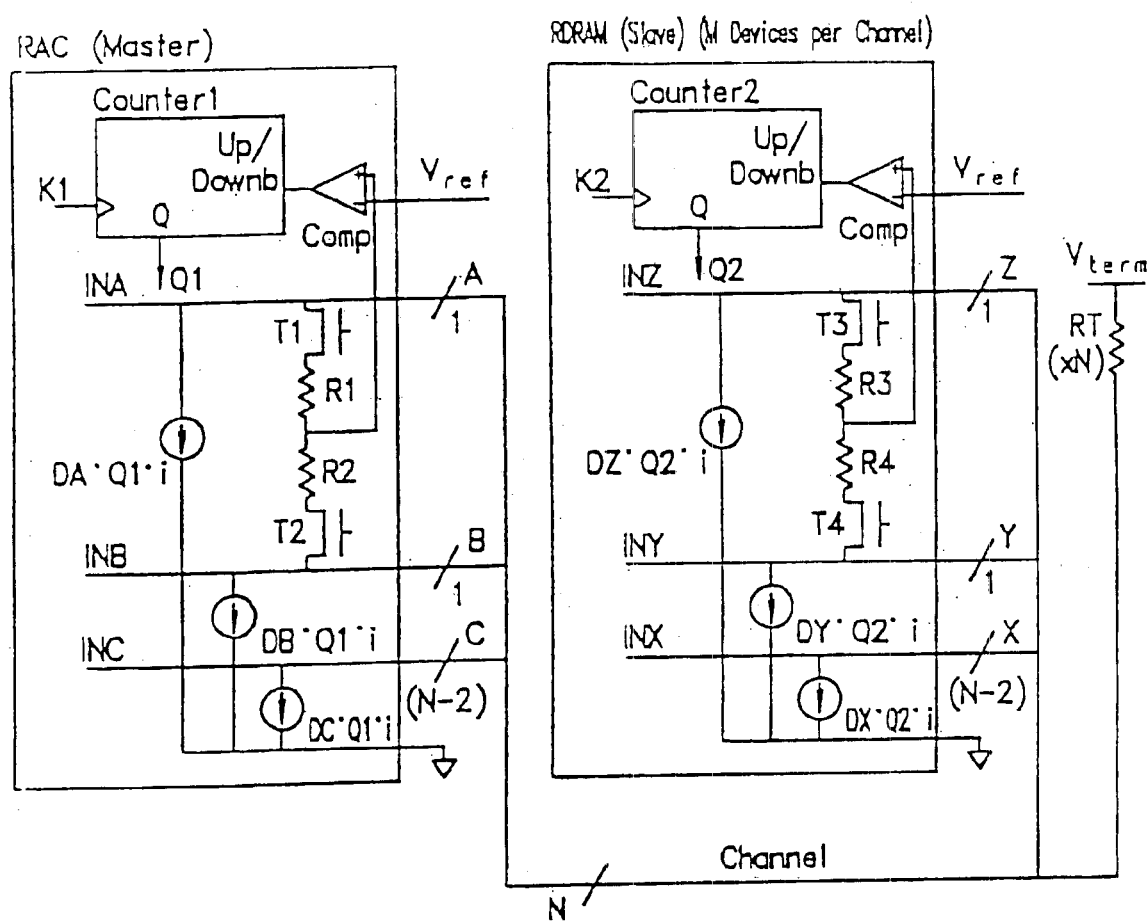
FIG. 3 illustrates current control circuitry in accordance with an embodiment of the present invention.
Figure 4:
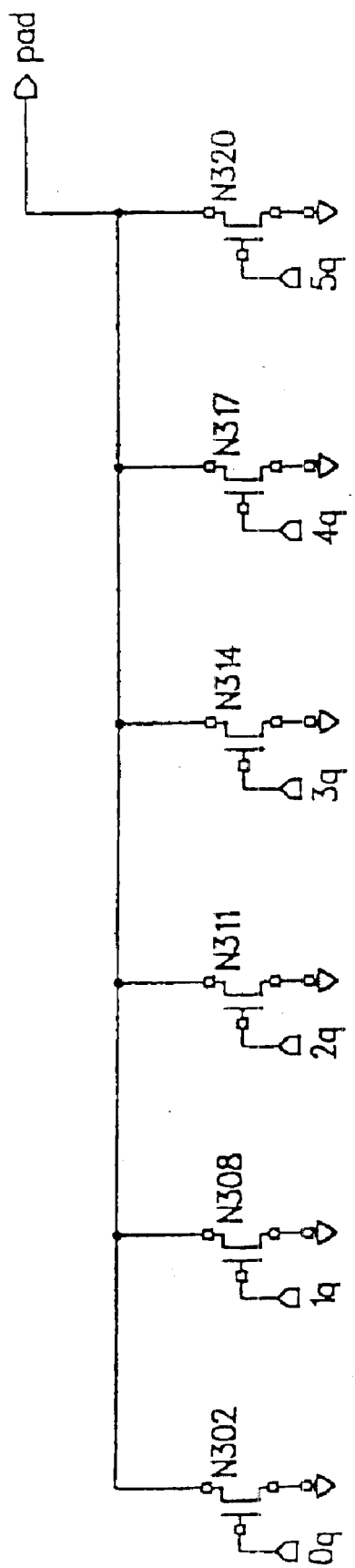
FIG. 4 illustrates an output driver which may be utilize in accordance with an embodiment of the invention.

FIG. 2 shows an overall diagram of an embodiment of the current control technique of the present invention. FIG. 3 is a schematic of the architecture utilized in accordance with the invention FIGS. 48 show circuit schematics of a specific implementation of the present invention.

The circuit of FIG. 2 includes the following components: an input isolation block (Isolation) 120, an analog voltage divider (AVD) 104, an input comparator 125, a sampling latch 130, a current control counter 115, and a bitwise output driver (output driver A 107 and output driver B 111).

As shown in connection with FIG. 1, the prior art relied upon an input comparator COMP in performing its current control functions. The present invention also uses an input comparator 125 for current control functions. However, unlike the prior art which received a control voltage from a dedicated eternal pin connected to a printed circuit board mounted resistor RT/2, the present invention uses a simple R over R resistive divider placed between an active output and a nonactive output. The output of the divider circuit is a voltage equal to $(V_{term}-V_{swing})/2$. This is exactly the value desired to compare against $V_{ref}$. It is desirable that these two are equal. If they are not, the current control circuit increments or decrements the counter and tracks any output current variations due to changes in current drive of the transistors (because of temperature or VDD changes).

The circuitry employs voltage divider circuitry 104 on both the master and slave devices. As shown in FIG. 2, the voltage divider circuitry is connected between bus drivers A and B, driver 107 and 11, respectively. This circuitry is activated when the operating current must be set in the bus drivers and deactivated when the bus drivers are used in normal operation.

Bus lines connected to the two selected drivers of the master are different from bus lines connected to the two selected drivers of the slave device. Consequently, the setting of an operating value of current in the master can proceed simultaneously with the setting of a value in the slave. If there are multiple slaves, each slave device may use bus drivers connected to a unique pair of bus lines so that the setting of the operating current in the several slaves may proceed concurrently. Preferably, all slave devices use the same pins.

A counter (e.g., 115) in the master and in the slave determines the value of the current in the current driver as discussed above. The count in the master and slave is determined by a feedback circuit which compares a voltage reference, $V_{ref}$, to a common node voltage, $V_{out}$, which is derived from the voltage divider circuitry. The feedback circuit assures, via the counter, that $V_{ref}$ is equal to $[V_{term}-(V_{term}-V_{out})/(1+\text{voltage divider ratio})]$ by adjusting current in a selected one of the drivers to which the voltage divider circuitry is connected. One of the drivers is left in the off condition, providing $V_{term}$ to the voltage divider. Thus, the common mode voltage swings a fixed amount equal to $(V_{term}-V_{ref})$ which is applied across the upper one of the resistors, R1 (FIG. 3), of the voltage divider when a resistive voltage divider is used. The lower me of the resistors, R2 (FIG. 3), has $g*(V_{term}-V_{ref})$ across it, where g is the voltage divider ratio. I.e., g R2/R1 where R1 is connected between the off driver and the center node and R2 is connected between the center node and the on driver. Typical values for R1 and R2 are approximately 10K ohms. Thus, $V_{out}$ equals $(1+g)*V_{ref}-g*V_{term}$. If the resistors are equal then g equals one and $V_{out}$ equals $2*V_{ref}-V_{term}$. For example, if $V_{term}$ is 1.8 volts and $V_{ref}$ is 1.4 volts, then $V_{ref}$ is 1.0 volts and the swing, $V_{swing}$, of $V_{out}$ is 0.8 volts. Also, the current in the output driver is now $V_{swing}/R_{term}$, which equals 0.8 volts/28=28.6 milliamps. For example, $R_{term}$ may be about 28 ohms. Typically, $R_{term}$ may be in the range from about 20 ohms to about 50 ohms.

When the voltage divider circuit is activated, the circuit itself creates a source of voltage error, caused by the current that flows through the voltage divider circuit from $V_{term}$, through the termination resistor, through R1 and R2 and to the output, driver which is in the on-state. This current causes the voltage of the driver in the off-state to be slightly less than $V_{term}$, say $e*V_{term}$, where e is a number close to one. Specifically, $e=1-[((V_{term}-V_{out}) N_{term})*(R_{term}/(R1+R2+R_{term}))]$. This current also causes the voltage of the driver in the on-state to be slightly higher than $V_{out}$ also by the same error term, say $e*V_{term}$. Therefore, using the suggested resistor values, e=0.998882 and $V_{out}$=1.002, so $V_{out}$ has a 2 millivolt error.

The feedback circuit assures that the common node of the voltage divider is locked to $V_{ref}$, so that the drop across R1 is $(e*V_{term}-V_{ref})$. The voltage drop across R2 is $e*V_{term}-V_{ref}$. The output voltage, $V_{out}$, is $2*V_{ref}-e*V_{term}$. So the output voltage is slightly higher than its value in the absence of the voltage divider. $V_{swing}$ is now $(1+e) V_{term}-2*V_{ref}$ and the current in the output driver is $V_{swing}/R_{term}+(V_{term}-e*V_{term})R_{term}=2*(V_{term}-V_{ref})R_{term}=30$ milliamps, as before. Thus, while the output voltage is altered slightly when the voltage divider circuit is activated, it does not affect the setting of current in the output driver or the counter value that controls that current.

Under ideal conditions the ratio of the resistors, g, is a precise value, such as unity. However, if some errors are present in the circuit, it is desirable to compensate for them by slightly altering the ratio. Some sources of error are currents into the comparator and hysteresis or offsets im the comparator. Another source of error is the circuitry used to activate the voltage divider circuitry, if the activation circuitry is in the form of pass gates in series with R1 and R2 of the voltage divider.

Alternatively, the error current that flows in the divider circuit may be negligible compared to the amount of curt controlled by one half of the least significant bit of the counter, if the resistances in the divider can be made large enough. The value of $(V_{term}-e^*V_{term})R_{term}$ is approximately 0.15 milliamps. The amount of current flowing through the voltage divider is $[(V_{term}-V_{out})/(R1+R2+R_{term})]$ or typically about 0.04 mA. Seven bits controlling 28.6 milliamps makes ½LSB equal to 0.11 milliamps.

Another reason for altering the ratio, g, is that the edge rate for a rig signal may be different from a falling signal on the output of the bus driver. Altering the voltage divider ratio so that the wing is not symmetric about $V_{ref}$ may be necessary to obtain the best noise margin for receiving the signal on the bus.

In one embodiment the relationship between the counter value and the current in the driver is linear. Such a driver uses binary weighted output transistor legs to adjust the current in single steps from 0 to $_2N$ where N is the number of current control bits. In other embodiments there are other relationships between the counter value and current in the driver. For example, a logarithmic relationship can be used. This allows more precision with smaller count values and less precision with larger count values.

In another embodiment, the counter counts up until the proper current is reached. After the initial setting, the counter counts up or down to adjust the current in the driver. In another embodiment, more complex algorithms are employed to find the correct value for the count. One such algorithm is binary searching until a value close to the correct value is found and then counting up or down to obtain the precise value.

In a further embodiment the feedback and counter circuit setting apply to all of the bus drivers of a device. In another embodiment there is a feedback and counter circuit for each or any number, FUN, of the bus drivers of a device. This latter embodiment has the advantage that ah driver is correctly set, but the disadvantage that more circuitry is required.

The setting of operating current in the bus driver can consume time on the bus, resulting in a loss of throughput. To eliminate this loss, in one embodiment, the setting of the current occurs during a period of time on the bus which cannot be used otherwise. If the slave devices are memory devices, that time is the time at which the memory devices are refreshed, which typically occurs every 16 microseconds for a duration of 80 ns. In some cases the setting of the operating current in the bus driver takes only about 20 ns, thus, the setting can occur concurrently with the refresh operation.

Figure 6:
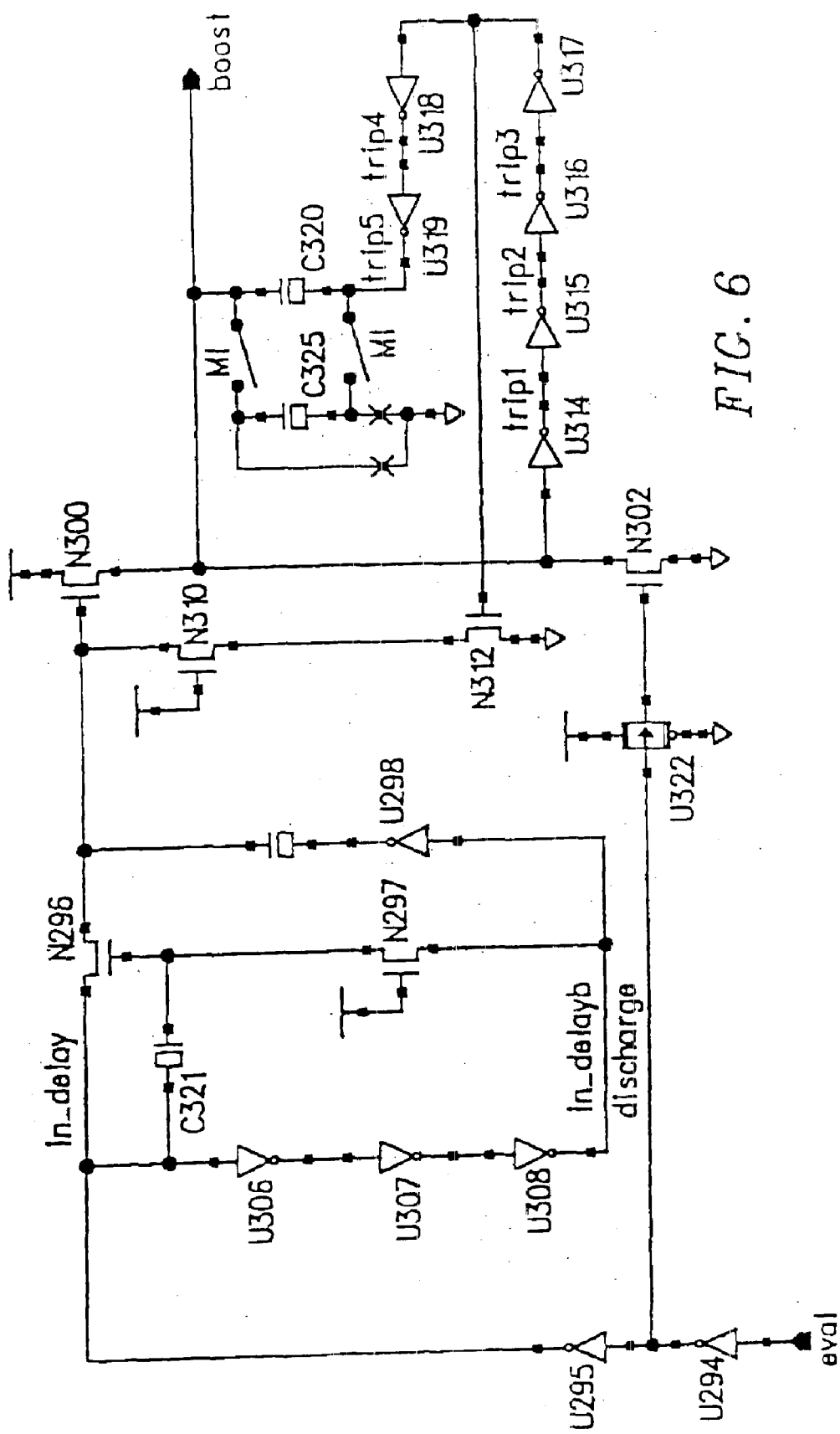
FIG. 6 shows circuitry for the gxCCbst1 element of FIG. 5, which may be used to generate a boosted voltage.

Connected to the voltage divider circuitry is a means for coupling the divider circuitry to the output lines to which it is attached. In one embodiment the means, for coupling is simply a wire attached between the voltage divider circuitry and the output lines. In an alternate embodiment the means for coupling is composed of a CMOS pass gate which serves to isolate the voltage divider circuitry from the output lines to which it is attached when the current control circuitry is not enabled. In another embodiment the means of coupling is an NMOS pass gate with boosted gate voltages. A typical circuit to generate the boosted gate voltage level is shown in FIG. 6.

Other embodiments employ unity gain buffers, operational amplifiers, transconductance, or sample-and hold circuitry to couple the voltage at the output lines with the voltage divider. Still other embodiments employ capacitors to couple a difference voltage from the output lines to the voltage divider, such as in some switched capacitor filters.

While the above discussion referred to a resistance voltage divider, other embodiments for dividers include the use of digital to analog converters or switched capacitor filters such as a sigma/delta modulator. An analog-to-digital converter may be used to convert the analog input voltage and/or $V_{ref}$ values to a digital value. Subsequent division and comparison may then be performed by digital signal processing.

Figure 7A:
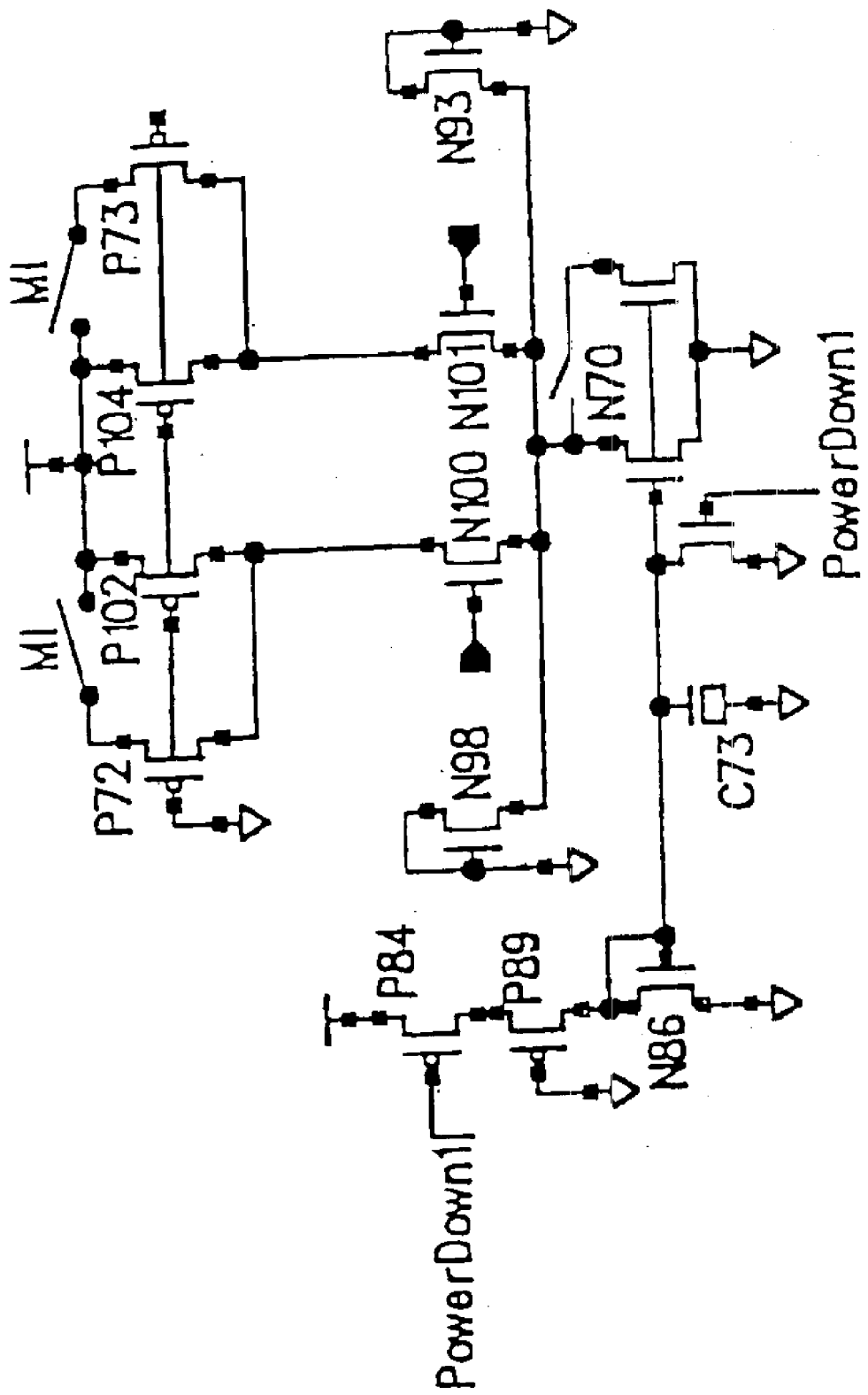
FIGS. 7A–7B show circuitry for an input comparator gxCComp of FIG. 5.
Figure 7B:
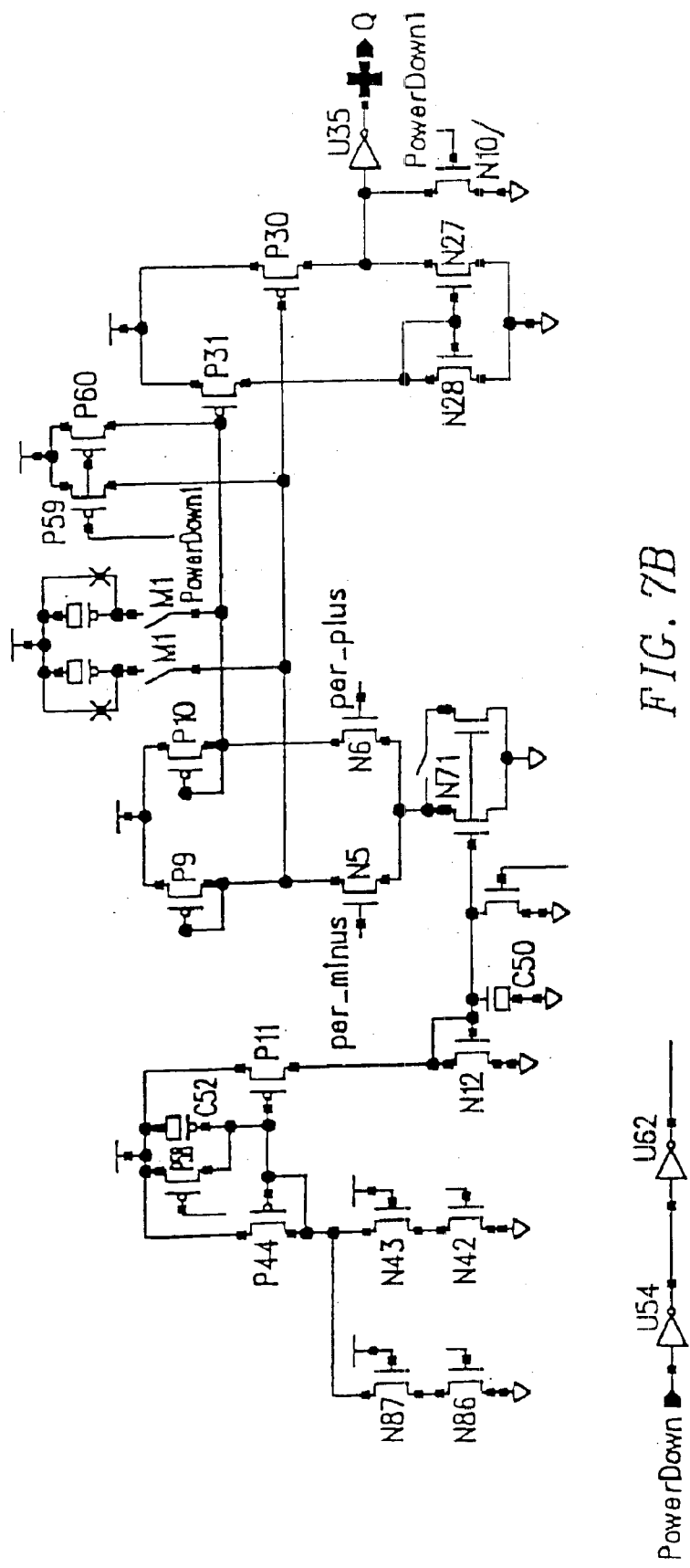

The output value from the voltage divider circuitry is compared to a voltage reference value. The comparator may be a simple analog differential voltage comparator shown in FIGS. 7A and 7B. In an alternate embodiment, the comparator may also be a regenerative sense-amp circuit. The comparator may also be a switched capacitor filter. In still another embodiment where an analog-to-digital converter is used as a voltage divider, the comparator may be a digital signal processor.

Preferably, the reference voltage is provided from an external pin. However, the reference voltage may also be generated with a band-gap reference circuit, or a voltage divider of Vdd or another voltage supply.

Figure 5:
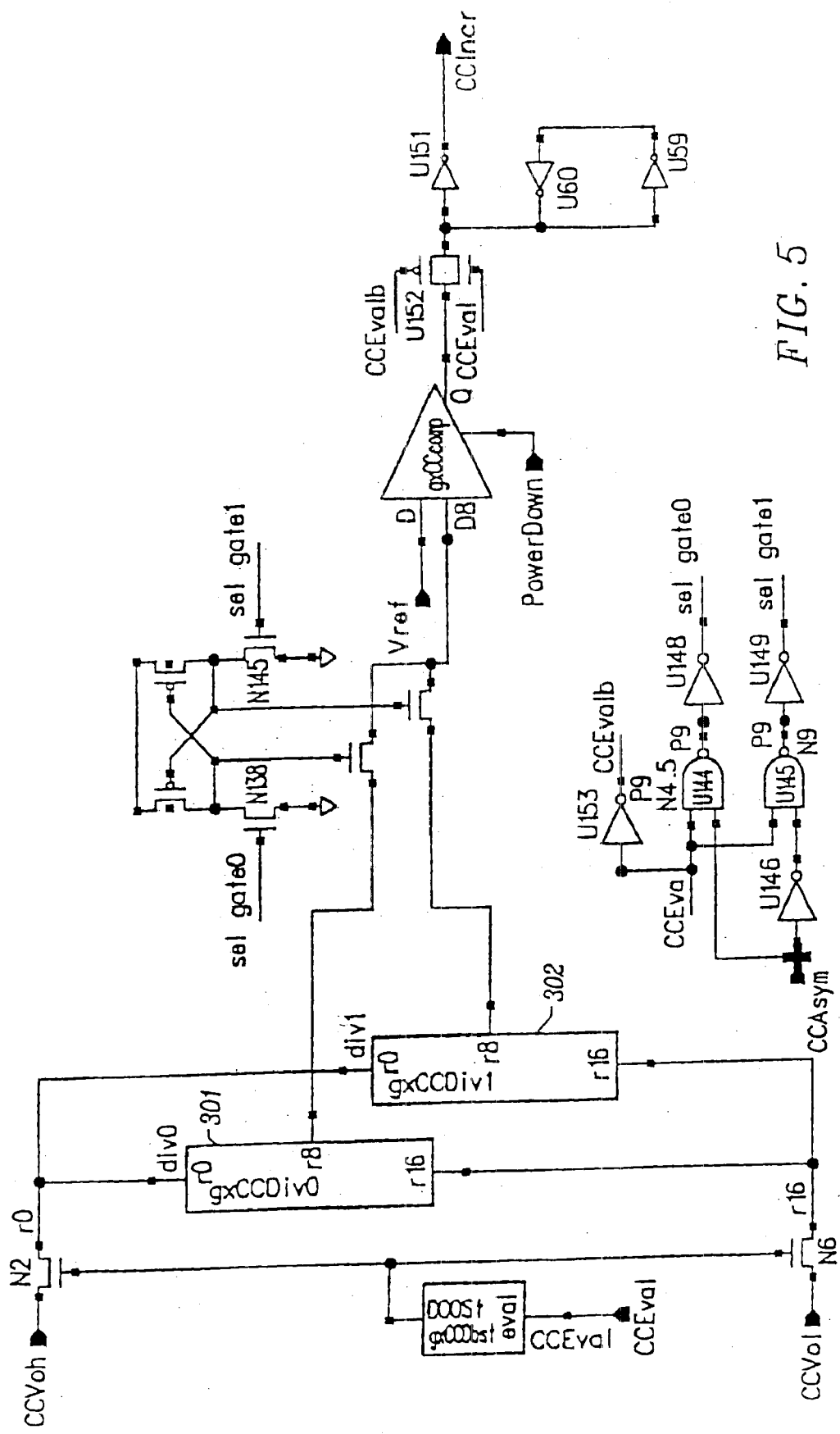
FIG. 5 is a detailed illustration of an implementation of the current control circuitry of the invention.
Figure 8:
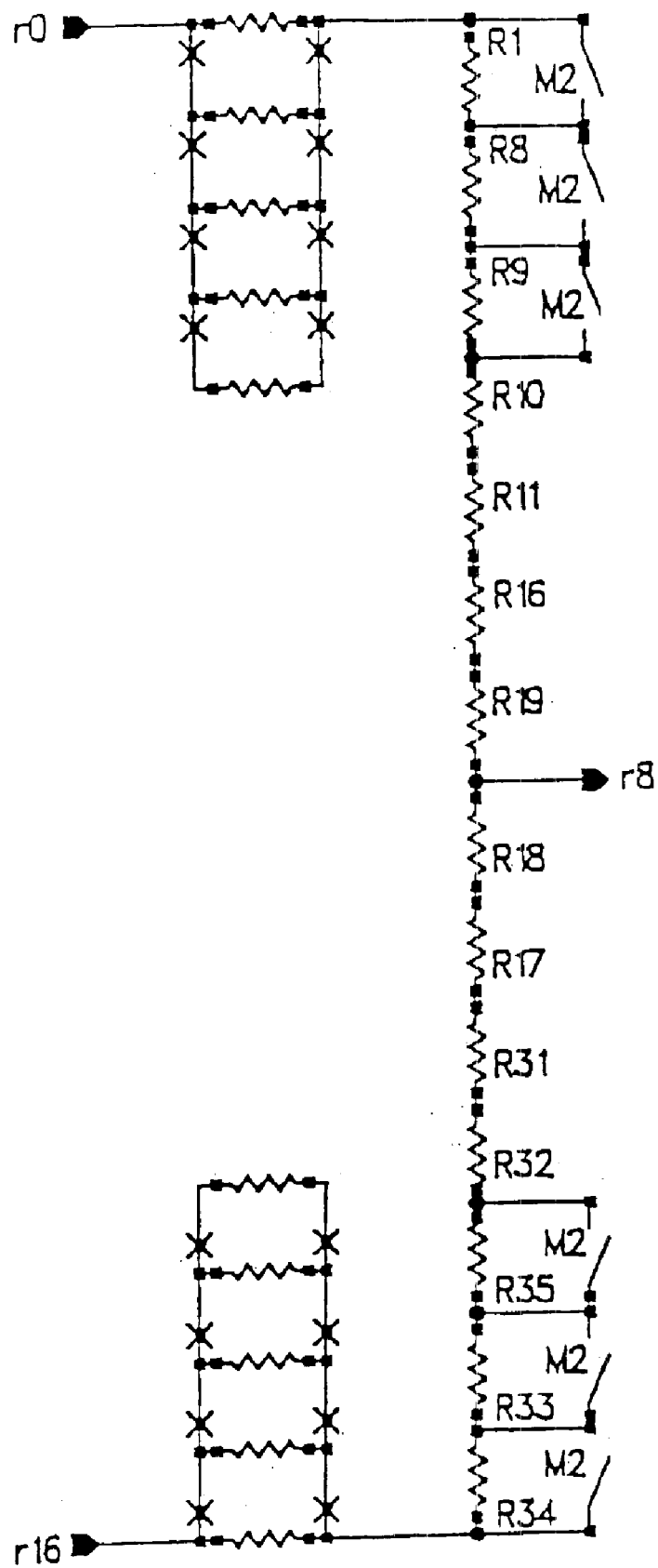
FIG. 8 shows a resistor divider implementation for gxCCDiv0 of FIG. 5.
Figure 9:
FIG. 9 shows a resistor divider implementation for gxCCDiv1 of FIG. 5.

Preferably, two voltage divider ratios are selectable. For example, FIG. 5 illustrates two voltage divider devices 301 and 302 that may be alternately selected. The actual voltage divider circuits may be implemented resistive ladders of the type shown in FIGS. 8 and 9.

In some embodiments, a sampling latch may be employed between the output of the comparator and the up-down counter. The sampling latch functions to average the output of the comparator so that the jitter on the counter is reduced.

The invention does not require the CC pin and external resistor shown in the prior art device of FIG. 1. The invention also provides better tracking than the device of FIG. 1. For FIG. 1, a fairly complex, and somewhat unwieldy current control initialization algorithm is required to find the proper start value for each slave device. However, with the present invention, implementing the current control scheme eliminates the need for complex initialization as each slave device automatically adjusts its own output to proper swing levels. Slave devices are instructed on a regular but infrequent basis to check the outputs. This may be accomplished during the same time a master device performs its calibration.

For the master device, the benefits of the present invention include the elimination of the CC pin and output driver and greater accuracy of setting the proper current swing. Estimates show that by implementing the current control technique of FIG. 2, an increase in voltage margin yields about 70 MHz of additional timing margin.

Moreover, for the technique of the present invention, there is no need for current control resistors on y-channel modules. However, the technique is also backwards compatible for modules that currently have such resistors.

Furthermore, the stave device automatically adjust its swing and monitors the current to adjust for variations in output drive due to voltage and temperature variations. Also, each slave device finds its own current control value depending on the process variations of the individual component.

The benefits of the present invention for the slave device include better swing accuracy (related to a similar benefit for the master device), elimination of the existing current control tracking logic in the slave device, and elimination of the current control initialization routine described in U.S. Pat. No. 5,254,883.

For the mar device, two pins are used for current control adjustment. One pin is driven to a logic one (low voltage)

and the other pin is not driven. The time this is done is under control of the control logic within the ASIC. The slave device is done at the same time, using different pins (for driving) than the master device is using. During this operation, a resistive divider is inserted between two pins, using pass transistors T1 and T2. These resistors halve the voltage between them and compare against the $V_{ref}$ voltage (already present on the chip). A counter is incremented if more current is needed to increase the voltage swing or decremented if too much voltage swing is detected. Although the digital adjustment is a simple up/down counter, a more sophisticated binary search can be implemented, followed by a simple adjust one up or down once the algorithm is completed. Such an embodiment is complicated, the savings of time to find the necessary set point may not justify elimination of a simple up/down counter.

For the slave device, two pins are used for current control adjustment. One pin is driven to a logic one (low voltage) and the other pin is not driven. This is done using a special register read command (or this could be done during a memory refresh to the same device). During this operation, a resistive divider is inserted between two pins, using pass transistors T3 and T4. These resistors halve the voltage between them and compare against the $V_{ref}$ voltage (already present on the chip). A counter is incremented if more current is needed to increase the voltage swing or decremented if too much voltage swing is detected. Although the digital adjustment is a simple up/down counter, a more sophisticated binary search could have been implemented, followed by a simple adjust one up or down once the algorithm is completed.

The new method use two of the N total pins, different pins for the mater and the slave. During current calibration, one slave and the master both calibrate at the same time, on different pins.

Figure 10:
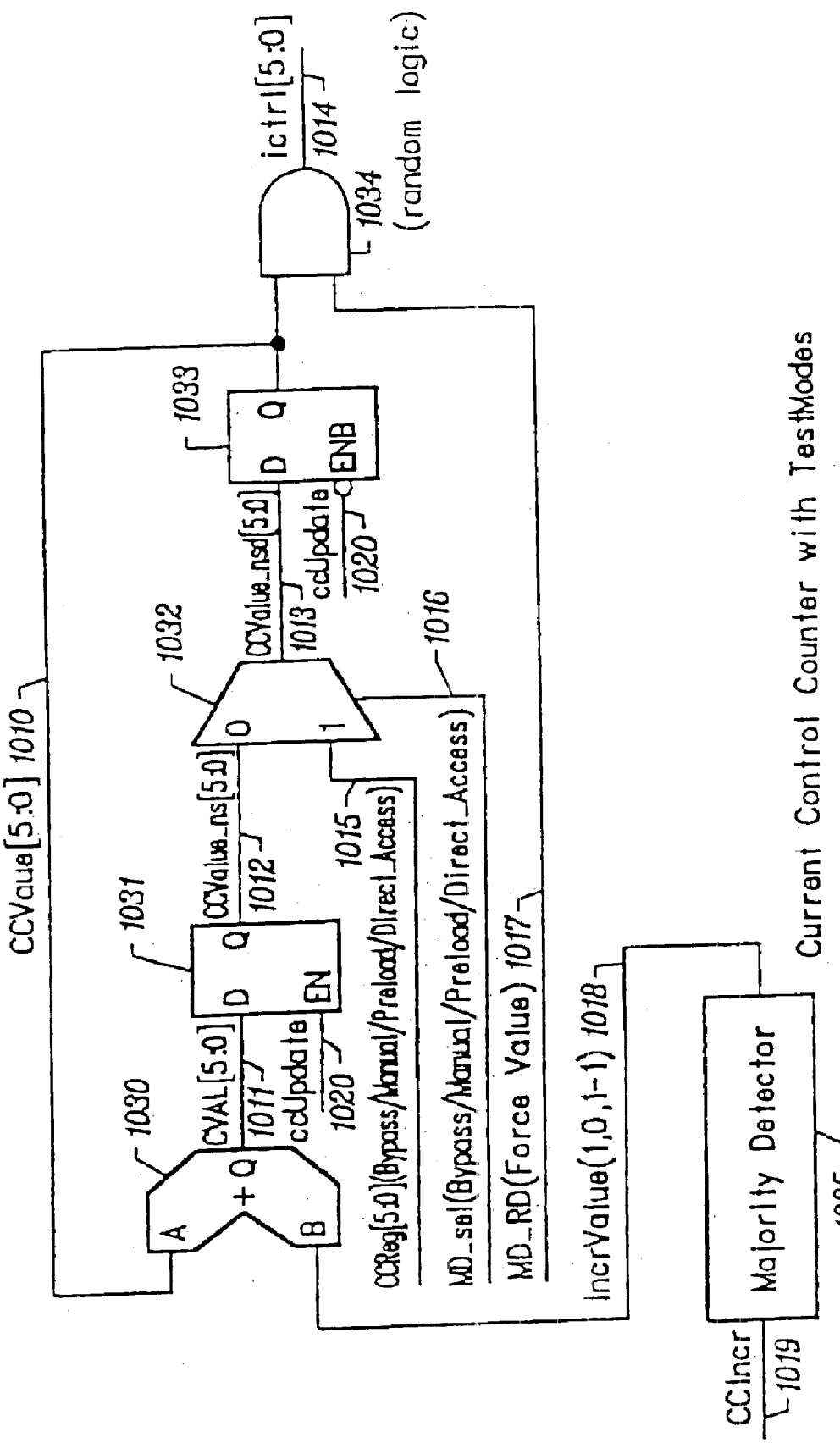
FIG. 10 illustrates control and test mode logic circuitry that may be used in accordance with an embodiment of the invention.

FIG. 10 illustrates control and test mode logic that may be used in connection with the invention. The current control counter includes an adder 1030, a master latch 1031, a multiplexer 1032, a slave latch 1033, random logic 1034, and a majority detector 1035. Using the control counter in FIG. 10, various modes of operations are possible. In a first mode, the circuitry is placed in an "auto mode" when MD_sel Bypass 1016 is deasserted and MD_RD 1017 is asserted. In the auto mode, CCValue_ns[5:0] 1012 is coupled to CCValue_nsd[5:01] 1013. Each ccUpdate 1020 pulse updates the current control value by one bit based on the Value Incr Value 1018 (which take values of 1, 0, or −1).

During initialization, a series of ccUpdate pulses will drive ictrl[5:] 1014 to approach its equilibrium value. Periodic updates may be done with subsequent ccUpdate pulses at specified intervals.

In a second mode the circuitry is placed in a "manual mode" when MD_sel Bypass 1016 is asserted and MD_RD 1017 is asserted. In the manual mode, CCValue_nsd[5:0] 1013 is coupled to CCreg[5:0] 1015. At the low phase of ccUpdate, the value of ictrl[5:0] is loaded into CCReg[5:0] 1015. This mode may be used to drive an arbitrary ictrl[5:0] value, or to preload the mast-slave flip flop (1033) before entering Auto mode. The same datapath is used during the Direct Access Test mode where test values of ictrl[5:0] are driven by changing CCReg[5:0]. A "mid" value of CCValue [5:0]=100000 may be preloaded at initialization so the equilibrium value is reached with fewer numbers of ccUpdate pulses.

The circuitry may also be placed in a "force mode" when MD_RD 1017 is de-asserted. In the force mode, a specific value may be forced at ictrl[5:0] when MD_RD 1017 is de-asserted. In the preferred embodiment, random logic forces ictrl[5:0]=101111. An alternate embodiment may implement a different forced value or values. This mode is used for testing and calibration.

The majority detector filters the value of CCIncr 1019 and prevents toggling of ictri[5:0] when the value is within one bit of the settled value. The majority detector takes an even number of samples of Signal CCIncr. The IncrValue 1018 is "1" if the majority of samples are high. The IncrValue 1018 is "−1" if the majority of samples are low. The IncrValue 1018 is bow if there is no majority.

Figure 11:
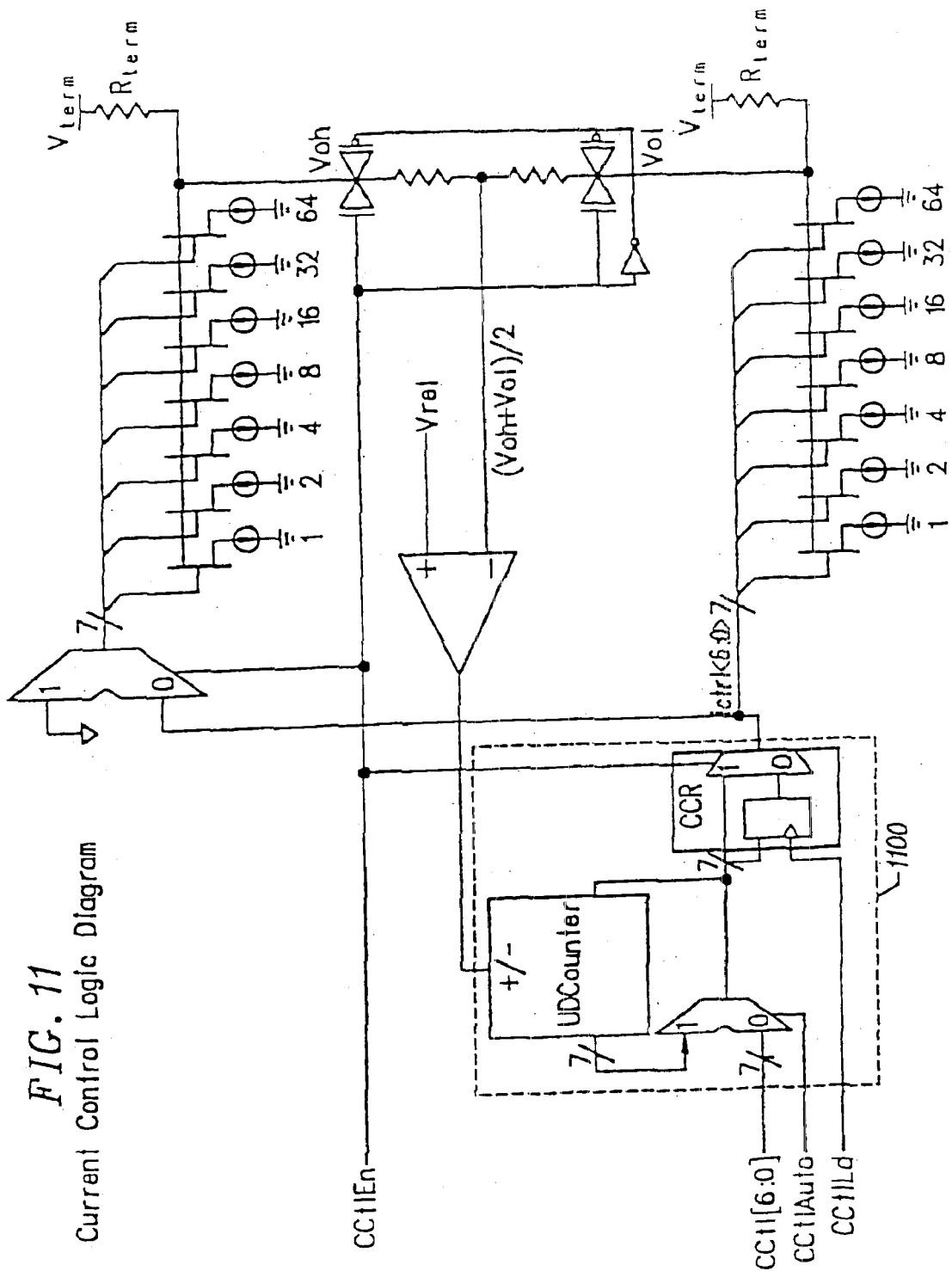
FIG. 11 illustrates a current control counter circuit that may be used in accordance with an embodiment of the invention.

FIG. 11 shows another embodiment of current control counter that may be used in accordance with the invention. This implementation uses a seven-bit ictrl value. The circuitry 1100 has three modes of operation L In a first mode, the circuitry is placed in an "auto-acquire mode" when CCtlEn is high and CCtlAuto is high. In the auto-acquire mode, the up-down counter is coupled to ictrl[6:0]. As the up-down counter is incremented or decremented, ictrl[6:0] is changed accordingly, until the equilibrium value of ictrl[6:0] is reached. At this point, the equilibrium value is loaded into CCR with signal CCtlLd, and the current control counter may enter Auto mode.

The circuitry may also be placed in an "auto mode" when CCtlEn is low and CCtlAuto is high. In the auto mode, the register in the CCR block controls the current setting of ictrl[6:0]. In this mode, the up-down counter is also coupled to the CCR register.

The circuitry also has a "manual mode" when CCtlEn is low and CCtlAuto is low. In the manual mode, a seven-bit value CCtl[6:0]is driven or stored into the counter and ictrl[6:0]. This mode is used to set a value into the counter and register that is close to the setting that will actually result in the auto-acquire mode, which cuts down on the time it takes to reach the equilibrium ictrl[6:0] value. This mode may also be used to set the counter and register to a certain value before the auto-acquire mode is entered. This mode may also be used as a test or direct access mode where specific values may be driven onto ictrl[6:0] by changing Ccd[6:0].

The current control circuitry may be implemented with a single output pin to perform current calibration. Both "high" and "low" voltage values are measured from the same pin sequentially with sample-and-hold circuitry. Subsequent processing of these voltage values are averaged with a voltage divider.

In another embodiment, the pin voltage values are measured during normal operation of the RDRAM. Based on data of the DRAM "read" operations, the current control circuitry determines when stable output "high" or "low" voltage patterns are present on the pin A single pin or multiple pins may be used to measure the pad voltage. Multiple samples and averaging may be performed to filter noise coupling and reflection on the output channel from the stable output "high" and "low" levels. This embodiment has the advantage of requiring no "quiet period" on the channel for current control calibration.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They ase not intended to be exhaustive or to limit the invention to the precise forms disclosed, obviously many modifications and variations are possible in view of the above teachings. The embodiments were chosen and described in order to best explain the principles of the invention and its practical applications, to thereby enable others, skilled in the art to best utilize the invention and various embodiments with various modifications as are suited to the particular use contemplated. It is intended that the scope of the invention be defined by the following claims and their equivalents.

What is claimed is:

1. A method of operation of an integrated circuit memory device comprising:
   receiving a command that specifies a calibration mode;
   while in the calibration mode, calibrating a voltage swing level to produce a calibrated voltage swing level, wherein calibrating includes:
      driving a signal having an amount of voltage swing onto a first signal line to produce a voltage level; and
      adjusting the amount of voltage swing of the signal based on a comparison between a reference voltage level and the voltage level produced by driving the signal; and
   exiting the calibration mode, wherein, upon exiting the calibration mode, the integrated circuit memory device is operable to drive data onto the first signal line in accordance with the calibrated voltage swing level.

2. The method of claim 1, wherein calibrating is performed concurrently with a memory refresh operation.

3. The method of claim 1, wherein the command that specifies the calibration mode is a register read command.

4. The method of claim 1, wherein calibrating is performed during initialization of the integrated circuit memory device, and wherein the method further comprises periodically updating the calibrated voltage swing level after initialization.

5. The method of claim 1, further including:
   actively coupling a comparator to the first signal line during the calibration mode;
   when the comparator is coupled to the first signal line, calibrating the voltage swing level by using the comparator to compare the voltage level produced by driving the signal onto the first signal line with the reference voltage level; and
   actively isolating the comparator from the first signal line upon exiting the calibration mode.

6. The method of claim 1, further including receiving the reference voltage level from a source external to the integrated circuit memory device.

7. The method of claim 1, further including generating the reference voltage level using a reference voltage generator disposed internally within the integrated circuit memory device.

8. The method of claim 1, wherein the amount of voltage swing is represented by a code held in a counter, wherein adjusting the amount of voltage swing further comprises updating the code.

9. The method of claim 8, wherein adjusting the amount of voltage swing includes activating a number of output driver transistors based on the code.

10. The method of claim 1, wherein the voltage level that is derived from the amount of voltage swing is derived by dividing between a predetermined voltage level and a voltage swing potential corresponding to the amount of voltage swing generated when the signal is driven onto the first signal line.

11. A method of operation of an integrated circuit memory device, the method comprising:
   during a memory refresh period, calibrating a voltage swing characteristic of an output driver of the integrated circuit memory device, wherein calibrating includes:
      driving a signal onto an external signaling path; and
      adjusting an amount of voltage swing of the output driver based on a comparison between a reference voltage level and a voltage level produced by driving the signal.

12. The method of claim 11, wherein adjusting the amount of voltage swing of the output driver includes:
   adjusting the amount of voltage swing in a first direction when the voltage level exceeds the reference voltage level; and
   adjusting the amount of voltage swing in a second direction when the reference voltage level exceeds the voltage level.

13. The method of claim 11, wherein the voltage swing characteristic of the output driver is calibrated periodically.

14. The method of claim 11, further including receiving a command that instructs the integrated circuit memory device to calibrate the voltage swing characteristic.

15. The method of claim 11, wherein adjusting the amount of voltage swing further includes:
   actively coupling a comparator to a signal line of the signaling path;
   comparing the voltage level with the reference voltage level using the comparator coupled to the signal line; and
   actively isolating the comparator from the signal line upon exiting the calibration mode.

16. The method of claim 15, wherein adjusting the amount of voltage swing further includes deriving the voltage level by dividing between a predetermined voltage level and a voltage swing potential produced by driving the signal.

17. The method of claim 11, further including receiving the reference voltage level.

18. The method of claim 11, further including generating the reference voltage level within the integrated circuit memory device.

19. The method of claim 11, further including storing a digital value in a register, wherein the digital value represents the amount of voltage swing of the output driver.

20. An integrated circuit memory device that is operable to calibrate a driver output voltage swing characteristic during a memory refresh period, the integrated circuit memory device comprising:
   a first output driver to drive a signal onto a first external signal line; and
   an adjustment circuit, coupled to the first output driver, to adjust an amount of voltage swing of the first output driver based on a comparison between a reference voltage level and a voltage level produced by driving the signal.

21. The integrated circuit memory device of claim 20, wherein:
   the amount of voltage swing is adjusted in a first direction when the voltage level exceeds the reference voltage level; and
   the amount of voltage swing is adjusted in a second direction when the reference voltage level exceeds the voltage level.

22. The integrated circuit memory device of claim 20, wherein the adjustment circuit includes a comparator to compare the reference voltage level and the voltage level produced by driving the sigal.

23. The integrated circuit memory device of claim 22, further including a reference voltage generator, coupled to the comparator, to generate the reference voltage level.

24. The integrated circuit memory device of claim 20, wherein the reference voltage level is received from a source external to the integrated circuit memory device.

25. The integrated circuit memory device of claim 20, further including a voltage divider coupled to the first external signal line and the first output driver, to produce the voltage level based on the amount of voltage swing generated, wherein the voltage level is determined based on a ratio of resistors of the voltage divider.

26. The integrated circuit memory device of claim 25, further including a second output driver coupled to a second external signal line, wherein the voltage divider includes a first end and a second end, wherein the first end is coupled to the first external signal line and the second end is coupled to the second external signal line.

27. The integrated circuit memory device of claim 20, further comprising a counter coupled to the adjustment circuit and the first output driver, wherein the amount of voltage swing is determined by a code held in the counter, wherein the code is adjusted based on the comparison between the reference voltage level and the voltage level produced by diving the signal.

28. The integrated circuit memory device of claim 27, wherein the first output driver includes a plurality of transistors, wherein the signal is driven onto the first external signal line by activating a number of transistors of the plurality of transistors, wherein the number of transistors activated is determined by the code.

29. The integrated circuit memory device of claim 20, wherein the first output driver includes a plurality of transistors, wherein the amount of voltage swing of the first output driver is determined by a number of transistors of the plurality of transistors activated.

30. A memory device that is operable to calibrate an amount of voltage swing of a driver means, wherein the memory device is a dynamic random access memory device, the memory device comprising:

driver means for driving a signal onto an external signal line;

adjustment means to adjust the amount of voltage swing of the driver means, wherein the amount of voltage swing is adjusted based on a comparison between a reference voltage level and a voltage level produced by driving the signal; and isolation means coupled to the driver means and adjustment means, the isolation means for isolating the adjustment means from the driver means such that the driver means is operable for driving data onto the external signal line in normal operation after the amount of voltage swing of the driver means has been calibrated.

31. The memory device of claim 30, wherein the adjustment means includes:

means for comparing the voltage level produced by driving the signal and the reference voltage level;

voltage dividing means to produce the voltage level based on the amount of voltage swing of the driver means; and counting means for storing a code representative of the amount of voltage swing, wherein the code is adjusted in response to the comparison between the voltage level and the reference voltage.

32. The memory device of claim 30, wherein the amount of voltage swing of the driver means is calibrated concurrently with a memory refresh operation.

33. The memory device of claim 30, wherein the amount of voltage swing of the driver means is calibrated periodically.

34. A memory device that is operable to calibrate an amount of voltage swing, wherein the memory device is a dynamic random access memory device, the memory device comprising:

a driver circuit to drive a signal onto an external signal line;

an adjustment circuit to adjust an amount of voltage swing of the driver circuit based on a comparison between a reference voltage level and a voltage level produced by the driver circuit driving the signal; and an isolation circuit coupled to the driver circuit and the adjustment circuit, the isolation circuit to isolate the adjustment circuit from the driver circuit such that the driver circuit is operable to drive data onto the external signal line after the amount of voltage swing of the driver circuit has been calibrate.

35. The memory device of claim 34, wherein the driver circuit includes a transistor having an effective width that is configured to adjust the amount of voltage swing of the output driver.

36. The memory device of claim 35, wherein the amount of voltage swing is represented by a code held in a counter and wherein the width of the transistor is configured based on the code, and wherein the code is adjusted based on the comparison between the reference voltage level and the voltage level derived from driving the signal.

37. The memory device of claim 34, wherein the amount of voltage swing is calibrated during a memory refresh operation.

38. The memory device of claim 34, wherein the driver circuit includes a first output driver and a second output driver, wherein the first output driver is coupled to the first external signal line and the second output driver is coupled to a second external signal line, and wherein the adjustment circuit includes a voltage divider coupled to the first and second external signal lines, wherein the voltage level produced by the driver circuit driving the signal is based on a ratio of resistors of the voltage divider.

39. The memory device of claim 34, wherein the adjustment circuit includes a comparator to compare the reference voltage level and the voltage level produced by driving the signal.

40. The memory device of claim 34, wherein:

the amount of voltage swing is adjusted in a first direction when the voltage level exceeds the reference voltage level; and the amount of voltage swing is adjusted in a second direction when the reference voltage level exceeds the voltage level.

41. The memory device of claim 34, further including a reference voltage generator, coupled to the comparator, to generate the reference voltage level.

42. The memory device of claim 34, wherein the isolation circuit includes a passgate that actively couples the adjustment circuit to the driver circuit in response to a command that specifies that the amount of voltage swing is to be calibrated.

* * * * *

UNITED STATES PATENT AND TRADEMARK OFFICE
CERTIFICATE OF CORRECTION

PATENT NO. : 6,870,419 B1
DATED : March 22, 2005
INVENTOR(S) : Garrett, Jr.

It is certified that error appears in the above-identified patent and that said Letters Patent is hereby corrected as shown below:

Column 13,
Line 2, the last word of the sentence, delete "sigal" and substitute -- signal --.

Column 14,
Line 24, the last word of the sentence, delete "calibrate" and substitute -- calibrated --.

Signed and Sealed this

First Day of November, 2005

JON W. DUDAS
*Director of the United States Patent and Trademark Office*